US010094549B2

(12) United States Patent
Hamid et al.

(10) Patent No.: US 10,094,549 B2
(45) Date of Patent: Oct. 9, 2018

(54) MICRO-CHANNEL HEAT SINK FOR LED HEADLAMP

(71) Applicant: Flex-N-Gate Advanced Product Development, LLC, Tecumseh (CA)

(72) Inventors: Muhammed Aquil Hamid, Canton, MI (US); Steve Barman, Canton, MI (US); Charles F. Schweitzer, Livonia, MI (US)

(73) Assignee: Flex-N-Gate Advanced Product Development, LLC, Windsor, Ontario (CA)

( * ) Notice: Subject to any disclaimer, the term of this patent is extended or adjusted under 35 U.S.C. 154(b) by 83 days.

(21) Appl. No.: 14/423,266

(22) PCT Filed: Aug. 22, 2013

(86) PCT No.: PCT/US2013/056184
§ 371 (c)(1),
(2) Date: Feb. 23, 2015

(87) PCT Pub. No.: WO2014/031849
PCT Pub. Date: Feb. 27, 2014

(65) Prior Publication Data
US 2015/0252997 A1    Sep. 10, 2015

Related U.S. Application Data

(60) Provisional application No. 61/692,196, filed on Aug. 22, 2012.

(51) Int. Cl.
*F21S 41/141*    (2018.01)
*F21V 29/71*    (2015.01)
(Continued)

(52) U.S. Cl.
CPC .......... *F21V 29/713* (2015.01); *F21S 41/141* (2018.01); *F21S 43/14* (2018.01); *F21S 45/42* (2018.01);
(Continued)

(58) Field of Classification Search
CPC ........ F21V 29/70–29/717; F21V 29/30; F21V 29/56–29/59; F21V 29/15;
(Continued)

(56) References Cited

U.S. PATENT DOCUMENTS 5,105,429 A    4/1992 Mundinger et al.
5,453,641 A    9/1995 Mundinger et al.
(Continued)

FOREIGN PATENT DOCUMENTS

WO    2011124354    10/2011
WO    2011126488    10/2011

OTHER PUBLICATIONS

Satish G. Kandlikar, Evolution of Microchannel Flow Passages—Thermohydraulic Performance and Fabrication Technology, IMECE2002-32043, proceedings of IMECE2002, Nov. 17-22, 2002, New Orleans, LA.
(Continued)

*Primary Examiner* — Anh Mai
*Assistant Examiner* — Steven Horikoshi
(74) *Attorney, Agent, or Firm* — Reichel Stohry LLP; Mark C. Reichel; Natalie J. Dean

(57) ABSTRACT

The present application discloses various embodiments of a heat sink for semiconductor devices and methods for using and constructing the same. According to at least one aspect of the present disclosure, a heat sink for cooling a semiconductor device includes a base plate including a first side and a second side; a leg extending from the second side of the base plate, the leg including a distal end opposite the base
(Continued)

plate and opposing walls extending between the base plate and the distal end; a leg plate disposed adjacent the distal end of the leg; a plurality of fins disposed between the distal end of the leg and the leg plate; and a plurality of microchannels defined by the distal end of the leg, the plurality of fins, and the leg plate.

24 Claims, 9 Drawing Sheets

(51) Int. Cl.
| | | |
|---|---|---|
| F21V 29/76 | (2015.01) | |
| H01L 33/64 | (2010.01) | |
| F21V 29/65 | (2015.01) | |
| F21V 29/83 | (2015.01) | |
| F21V 29/58 | (2015.01) | |
| F21V 29/60 | (2015.01) | |
| F21V 29/74 | (2015.01) | |
| F21S 43/14 | (2018.01) | |
| F21S 45/42 | (2018.01) | |
| F21S 45/47 | (2018.01) | |
| F21Y 115/10 | (2016.01) | |

(52) U.S. Cl.
CPC .............. *F21S 45/47* (2018.01); *F21V 29/59* (2015.01); *F21V 29/60* (2015.01); *F21V 29/65* (2015.01); *F21V 29/74* (2015.01); *F21V 29/76* (2015.01); *F21V 29/83* (2015.01); *H01L 33/648* (2013.01); *F21Y 2115/10* (2016.08)

(58) Field of Classification Search
CPC ............................ F21S 48/115–48/1163; F21S 48/1104–48/1122; F21S 48/32–48/328; F21S 41/141–41/155; F21S 41/19–41/198; H01L 33/64–33/648; B60Q 1/04–1/200683; B60Q 1/0686
See application file for complete search history.

(56) References Cited

U.S. PATENT DOCUMENTS

| | | | | |
|---|---|---|---|---|
| 5,848,082 | A | 12/1998 | Shum | |
| 6,388,317 | B1* | 5/2002 | Reese | H01L 23/473 257/713 |
| 6,422,307 | B1* | 7/2002 | Bhatti | F28F 3/02 165/185 |
| 6,880,956 | B2 | 4/2005 | Zhang | |
| 7,277,284 | B2 | 10/2007 | Lee et al. | |
| 2004/0066625 | A1 | 4/2004 | Meyer et al. | |
| 2004/0208009 | A1* | 10/2004 | Mardon | F21K 9/00 362/373 |
| 2005/0276053 | A1* | 12/2005 | Nortrup | F21S 48/325 362/294 |
| 2006/0011325 | A1 | 1/2006 | Schlitz | |
| 2006/0034052 | A1* | 2/2006 | Chang | H05K 1/0272 361/697 |
| 2006/0076572 | A1* | 4/2006 | Huber | F21S 48/1154 257/99 |
| 2006/0169441 | A1 | 8/2006 | Schlitz | |
| 2007/0001582 | A1* | 1/2007 | Shin | F21K 9/00 313/498 |
| 2007/0084585 | A1* | 4/2007 | Takagi | F28D 9/0043 165/80.4 |
| 2007/0091622 | A1* | 4/2007 | Huang | F21V 29/004 362/373 |
| 2008/0094841 | A1 | 4/2008 | Dahm | |
| 2008/0219002 | A1* | 9/2008 | Sommers | A47F 3/001 362/247 |
| 2008/0237847 | A1* | 10/2008 | Nakanishi | H01L 23/473 257/722 |
| 2008/0308258 | A1 | 12/2008 | Pan et al. | |
| 2008/0315403 | A1* | 12/2008 | Andry | H01L 23/473 257/713 |
| 2009/0025909 | A1 | 1/2009 | Huang | |
| 2009/0059594 | A1* | 3/2009 | Lin | F21K 9/00 362/294 |
| 2009/0071625 | A1 | 3/2009 | Lyon | |
| 2009/0207626 | A1* | 8/2009 | Kim | B60Q 1/0683 362/545 |
| 2009/0294105 | A1* | 12/2009 | Sundararajan | H01L 23/473 165/104.33 |
| 2009/0314470 | A1 | 12/2009 | Yang | |
| 2010/0091495 | A1 | 4/2010 | Patrick | |
| 2010/0237774 | A1* | 9/2010 | Yamazaki | H05B 33/22 313/506 |
| 2011/0026251 | A1 | 2/2011 | Liu et al. | |
| 2011/0051453 | A1* | 3/2011 | Nagasawa | B60Q 1/007 362/547 |
| 2011/0204261 | A1 | 8/2011 | Dahm et al. | |
| 2011/0220332 | A1 | 9/2011 | Abenaim | |
| 2011/0299279 | A1 | 12/2011 | Igl et al. | |
| 2012/0008330 | A1 | 1/2012 | Horng et al. | |
| 2012/0038272 | A1 | 2/2012 | De Castro | |
| 2012/0049233 | A1 | 3/2012 | Yuan | |
| 2012/0063156 | A1 | 3/2012 | Yasuda et al. | |
| 2012/0080176 | A1 | 4/2012 | Lee et al. | |
| 2012/0275152 | A1* | 11/2012 | Payne | F21V 29/74 362/249.01 |
| 2013/0077335 | A1 | 3/2013 | Murley et al. | |

OTHER PUBLICATIONS

International Serach Report and Written Opinion for PCT/US2013/056184 dated March 6, 2014, 11 pages.

* cited by examiner

MICRO-CHANNEL HEAT SINK FOR LED HEADLAMP

CROSS-REFERENCE TO RELATED APPLICATIONS

The present application is a U.S. National Phase of International PCT Application No. PCT/US2013/056184 filed on Aug. 22, 2013, and is also related to, and claims the priority benefit of, U.S. Provisional Patent Application Ser. No. 61/692,196, filed Aug. 22, 2012, each of which is hereby incorporated by reference in their entirety into this disclosure.

BACKGROUND

Improvements in semiconductor materials and in the packaging of microelectronic devices, such as integrated circuits and light-emitting diodes ("LEDs"), have enabled many new applications for these devices but have also resulted in new technical challenges. For example, the efficacy of LEDs has improved to the point that their use in exterior automotive lighting is technically and economically feasible, including for such high light output functions as headlamps. However, one challenge is the need to dissipate significant quantities of heat generated by these newer LEDs, which have ever-increasing power densities. The performance of LEDs is particularly sensitive to heat because excessive junction temperatures not only limit the light output of an LED but may also shorten its operating life significantly. Therefore, it is critical that heat generated by the LED be transferred away from the LED at a rate great enough to maintain the interface between the different semiconductor materials comprising the LED (i.e., the junction) within an acceptable operating temperature range.

For LED usage in an automotive headlamp, the heat dissipation problem is further compounded by the operating environment of an automotive headlamp, which typically combines exposure to high temperatures from the engine compartment, limited packaging volume due to the space constraints at the front end of an automobile, and a fully enclosed package needed to prevent dust and moisture from degrading the performance of the headlamp. Known solutions, such as conventional heat sinks with large fins or active cooling mechanisms, are costly and bulky and are not practical solutions for an LED headlamp application. The use of cooling fans adds mass, volume, and cost to a headlamp and requires additional power consumption, at least partially negating a primary advantage of using LEDs. Likewise, due in part to the enclosed package of a headlamp, conventional heat sinks must be heavy and bulky to effectively cool the LEDs. Accordingly, a need exists for a heat sink device for use with LEDs in a vehicle headlamp that reduces mass, volume, and the need for additional power requirements.

SUMMARY

The present application discloses various embodiments of a heat sink for semiconductor devices and methods for using and constructing the same. According to at least one aspect of the present disclosure, a heat sink for cooling a semiconductor device includes a base plate including a first side and a second side; a leg extending from the second side of the base plate, the leg including a distal end opposite the base plate and opposing walls extending between the base plate and the distal end; a leg plate disposed adjacent the distal end of the leg; a plurality of fins disposed between the distal end of the leg and the leg plate; and a plurality of micro-channels defined by the distal end of the leg, the plurality of fins, and the leg plate. The surface area of the first side of the base plate is greater than the surface area of the distal end of the leg. The first side of the base plate further includes a portion adapted to receive and make thermal contact with a semiconductor device. The base plate further includes one or more flow channels formed in the first side in fluid communication with the portion.

In at least one embodiment according to the present disclosure, the semiconductor device is a light-emitting diode. The leg is integrally formed with the base plate. The plurality of fins are integrally formed with the leg. The leg plate is formed of a thermally insulative material. The base plate and the leg are formed of a thermally conductive material, such as a metal. In at least one embodiment, the heat sink includes one or more headers formed in each of the opposing walls of the leg at or near the distal end, each header in fluid communication with the plurality of micro-channels.

In at least one embodiment according to the present disclosure, each micro-channel has a width between about 10 and about 500 microns, such as approximately 400 microns. Each micro-channel has a depth between about 500 and about 5,000 microns, such as approximately 2,000 microns. The leg has a length from the base plate to the distal end of between about 30 and about 45 millimeters, such as approximately 38 millimeters. The surface area of the first side of the base plate is about 3,000 square millimeters, and the thickness of the base plate from the first side to the second side is about 10 millimeters.

In at least one embodiment according to the present disclosure, a micro-channel heat sink for cooling a light-emitting diode includes a base plate including a first side and a second side; a plurality of micro-channels formed in the first side; a back plate disposed adjacent the second side of the base plate, wherein the base plate is adapted to receive and make thermal contact with a light-emitting diode, such that the plurality of micro-channels are in fluid communication with the light-emitting diode. In at least one embodiment, the heat sink includes a middle plate disposed adjacent the first side of the base plate between the light-emitting diode and the plurality of micro-channels, the plurality of micro-channels in thermal contact with the LED via the middle plate. In at least one embodiment, the heat sink further includes one or more inlets into the base plate, the one or more inlets in fluid communication with the plurality of micro-channels; one or more outlets from the base plate, one or more outlets in fluid communication with the plurality of micro-channels; and a pump fluidly connected to at least the one or more inlets, wherein the pump is capable of forcing a fluid to flow through at least some of the plurality of micro-channels. The back plate is formed of a thermally insulative material. The surface area of the front side of the base plate is about 900 square millimeters, and the thickness of the base plate from the first side to the second side is about 10 millimeters.

In at least one embodiment according to the present disclosure, a lamp for a vehicle includes a lens attached to a housing, the lens and the housing defining a volume, and a heat sink disposed within the volume. The heat sink includes a base plate including a first side and a second side; a leg extending from the second side of the base plate, the leg including a distal end opposite the base plate and opposing walls extending between the base plate and the distal end; a leg plate disposed adjacent the distal end of the leg; a plurality of fins disposed between the distal end of the leg and the leg plate; and a plurality of micro-channels defined by the distal end of the leg, the plurality of fins, and the leg plate. The lamp further includes a light-emitting diode attached to and in thermal contact with the first side of the base plate, and the plurality of micro-channels are in fluid communication with the volume.

BRIEF DESCRIPTION OF THE DRAWINGS

The described embodiments and other features, advantages, and disclosures contained herein, and the manner of attaining them, will become apparent, and the present disclosure will be better understood by reference to the following description of various exemplary embodiments of the present disclosure taken in conjunction with the accompanying drawings, wherein.

Like reference numerals indicate the same or similar parts throughout the several figures.

Figure 1:
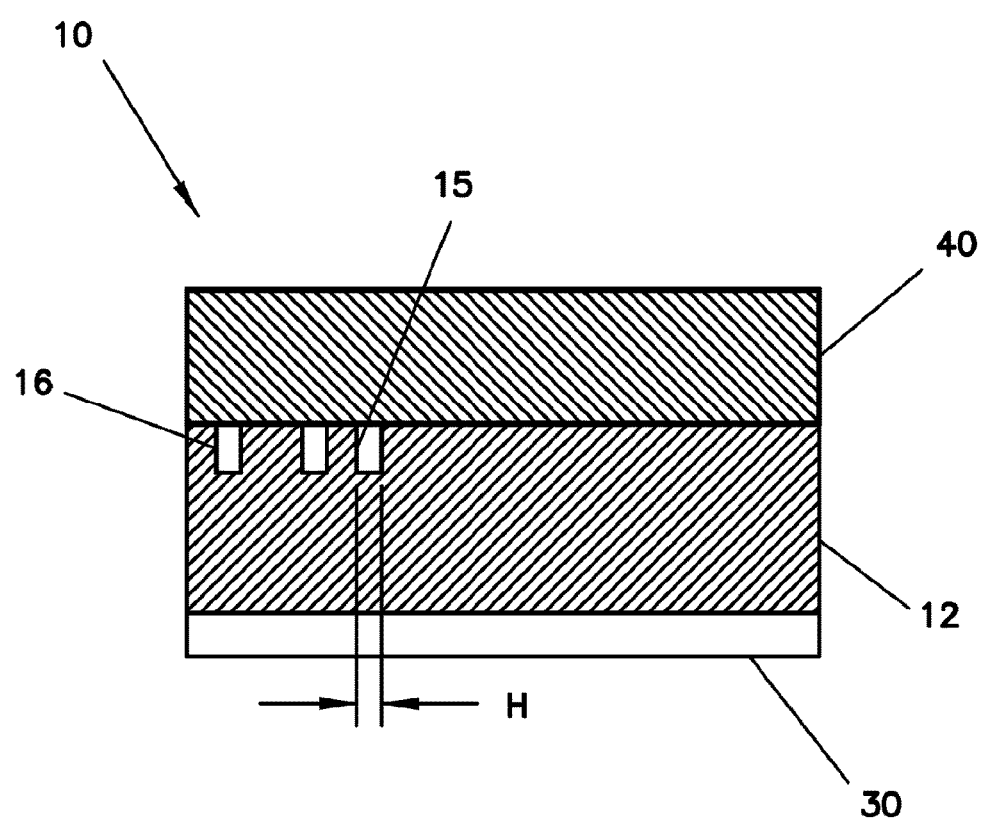
FIG. 1 shows a side view of a micro-channel heat sink according to at least one embodiment of the present disclosure.

An overview of the features, functions and configuration of the components depicted in the various figures will now be presented. It should be appreciated that not all of the features of the components of the figures are necessarily described. Some of these non-discussed features, such as various couplers, etc., as well as discussed features are inherent from the figures. Other non-discussed features may be inherent in component geometry or configuration.

DETAILED DESCRIPTION

The present application discloses various embodiments of a heat sink for semiconductor devices and methods for using and constructing the same. According to one aspect of the present disclosure, a micro-channel heat sink for cooling an LED within a vehicle headlamp is disclosed. For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

Though the details of construction vary by manufacturer, an LED generally includes a light-emitting diode chip or die mounted to, but electrically isolated from, a thermally conductive substrate sometimes referred to as a slug. The thermal capacitance of the slug is not adequate to maintain the junction temperature of the die within a safe operating range, under even normal operating conditions of supply current and ambient temperature, without additional means for transferring heat from the die. Consequently, it is advantageous to thermally connect the slug to an external heat sink to improve the potential rate of heat transfer, and thereby cooling, of the LED die.

A micro-channel heat sink of the present disclosure provides an improved heat sink particularly suited for use in cooling one or more LEDs used as a light source within a vehicle headlamp. Though useful for removing heat from one or more LEDs, for example, within an automotive headlamp, the micro-channel heat sink may also be useful for removing heat from an LED mounted within any type of vehicle lamp or lighting product generally. Further, the micro-channel heat sink may be useful to cool any heat-generating electronic component, including without limitation microelectronic integrated circuit chips, laser diodes, and the like.

A micro-channel heat sink according to at least one embodiment of the present disclosure is shown in FIG. 1. As shown in FIG. 1, a micro-channel heat sink 10 includes a base plate 12 and a plurality of micro-channels 16 of width H formed therein. The micro-channels 16 may be separated from one another by micro-fins 15, which may be oriented vertically relative to gravity to enable free convective flow through the micro-channels 16. In at least one embodiment, each of the plurality of micro-channels 16 have the same width H. Alternatively, the micro-channels 16 may be different widths. The base plate 12 may be formed of a thermally conductive material, including without limitation metals, such as aluminum and copper, and composite polymers, such as polyaniline, polypyyrole and polythiophenes.

In FIG. 1, the micro-channel heat sink 10 is shown mounted to an electronic device, for example, an LED 40, such that the micro-channels 16 are adjacent and in direct contact with the LED 40. In an alternative embodiment, the micro-channels 16 may be formed in the base plate 12 such that the micro-channels 16 are adjacent, but not in direct contact with, the LED 40. Regardless, the micro-channels 16 are formed to enable the flow of a thermal transfer fluid (not shown) through the micro-channels 16, thereby enabling convective heat transfer between the heat sink 10 and the fluid. The thermal transfer fluid may include, as non-limiting examples, gases such as ambient air or liquids such as water, propylene glycol, or other suitable coolant fluid. In the configuration shown in FIG. 1, the thermal transfer fluid directly contacts at least some portion of the LED 40 while other portions of the LED 40 are in direct contact with the base plate 12 and/or at least some of the plurality of micro-fins 15. As a result, the heat sink 10 enables both conductive and convective heat transfer directly from the LED 40. The heat sink 10 may further include an insulating plate 30 to insulate the base plate 12 from the ambient environment.

The micro-channel heat sink 10 enables radiative, conductive, and convective forms of heat transfer but principally acts first to conduct heat away from the LED 40 and then to dissipate the conducted heat to the ambient environment via convection. A portion of the heat from the heat sink 10 is radiated to surfaces and objects in the surrounding environment. Conduction from the LED 40 to the heat sink 10 may be facilitated by minimizing the thermal resistance of the interface between the LED 40 and the heat sink 10 with the use of thermally conductive grease or adhesive, as non-limiting examples. Convection from the surfaces of the heat sink 10 to the ambient environment is dependent on a number of factors. The rate of convective heat transfer from the heat sink 10 is given by:

$$q=hA(T_s-T_a)$$

where q is the rate of heat transfer, h is the heat transfer coefficient, A is the surface area of the heat sink, $T_s$ is the temperature of the heat sink 10, and $T_a$ is the temperature of the ambient environment. Convective heat transfer at a given ambient temperature can be increased by increasing the surface area, the heat transfer coefficient, or both. However, each incremental increase in surface area of the heat sink 10 may add size and mass, which are not desirable given the increasing weight sensitivity of vehicles and compactness of lamps. However, by increasing the heat transfer coefficient the overall heat transfer capacity of the heat sink 10 may be improved without increasing its size and mass.

Figure 2:
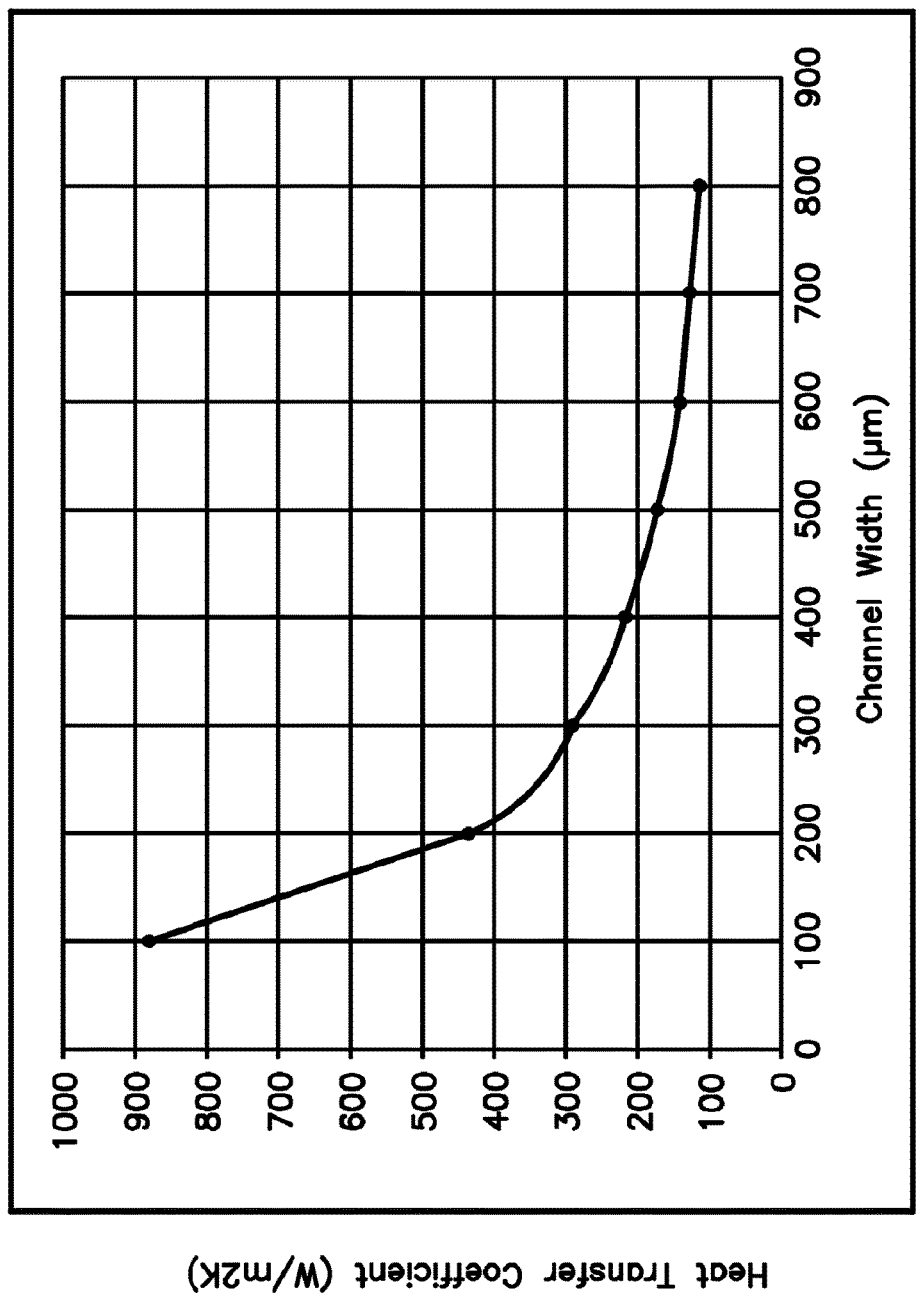
FIG. 2 depicts variation in convective heat transfer coefficient in Watts per meter-squared Kelvin (W/m2K) in relation to channel size in microns (μm)

For air flow within a channel, the convective heat transfer coefficient may be expressed as:

$$h=(Nuk)/H$$

where Nu is the Nusselt number, k is the thermal conductivity of air, and H is the channel width. The Nusselt number is a dimensionless parameter that represents the ratio of convective to conductive heat transfer at the boundary between the surface of the heat sink 10 and the ambient environment. Accordingly, the effect of varying channel width H on the heat transfer coefficient is to increase the heat transfer coefficient as the channel width H decreases. An example of this relationship for an analogous condition of fully developed flow through a tube is illustrated in FIG. 2. Further, a key dimensionless parameter for fluid flow through a micro-channel 16 is the Knudsen number, which is defined as the ratio of the molecular mean free path length $\lambda$ to width of a channel H or:

$$Kn=\lambda/H$$

The Knudsen number for channel widths H greater than approximately 400 µm is less than 0.001 and corresponds to a region of continuum flow, wherein conventional fluid mechanics are applicable. As the width of the micro-channel 16 is reduced and the Knudsen number increases beyond 0.001, molecular flow and wall slip effects begin to affect the mechanics of the fluid flow, and the heat transfer coefficient increases. Moreover, axial conduction of heat along the micro-channel 16 becomes a significant effect, further improving the overall heat transfer rate of the heat sink 10. The heat sink 10 may be configured to operate within this flow regime to exploit both the continuum and wall slip flow mechanisms that result in increased heat transfer coefficients. However, as the width H of the micro-channel 16 is further reduced and the Knudsen number increases beyond 0.1, rarefaction effects in the flow become significant, and the heat transfer coefficient decreases. For this reason, flow regimes and channel widths H corresponding to Knudsen numbers greater than 0.1 are not preferred.

Consequently, the preferred range of channel widths H included in the micro-channel heat sink 10 is 10-400 µm. Within this range the benefits of continuum, molecular, and wall slip flow mechanisms exceed the negative influence of the rarefied flow effects on the heat transfer characteristics within the micro-channels 16, resulting in increased heat transfer coefficients. In addition, fabrication costs for the heat sink 10 are reasonable in this range of channel widths H. Accordingly, the micro-channel heat sink 10 of the present disclosure enables increased convective heat transfer to the ambient environment, thereby increasing the thermal load carrying capacity of vehicle lamps using LEDs without increasing the mass or size of the heat sink 10. The improvement in the thermal load carrying capacity of the heat sink 10 further enhances design flexibility for engineers and designers using the heat sink 10.

Figure 3:
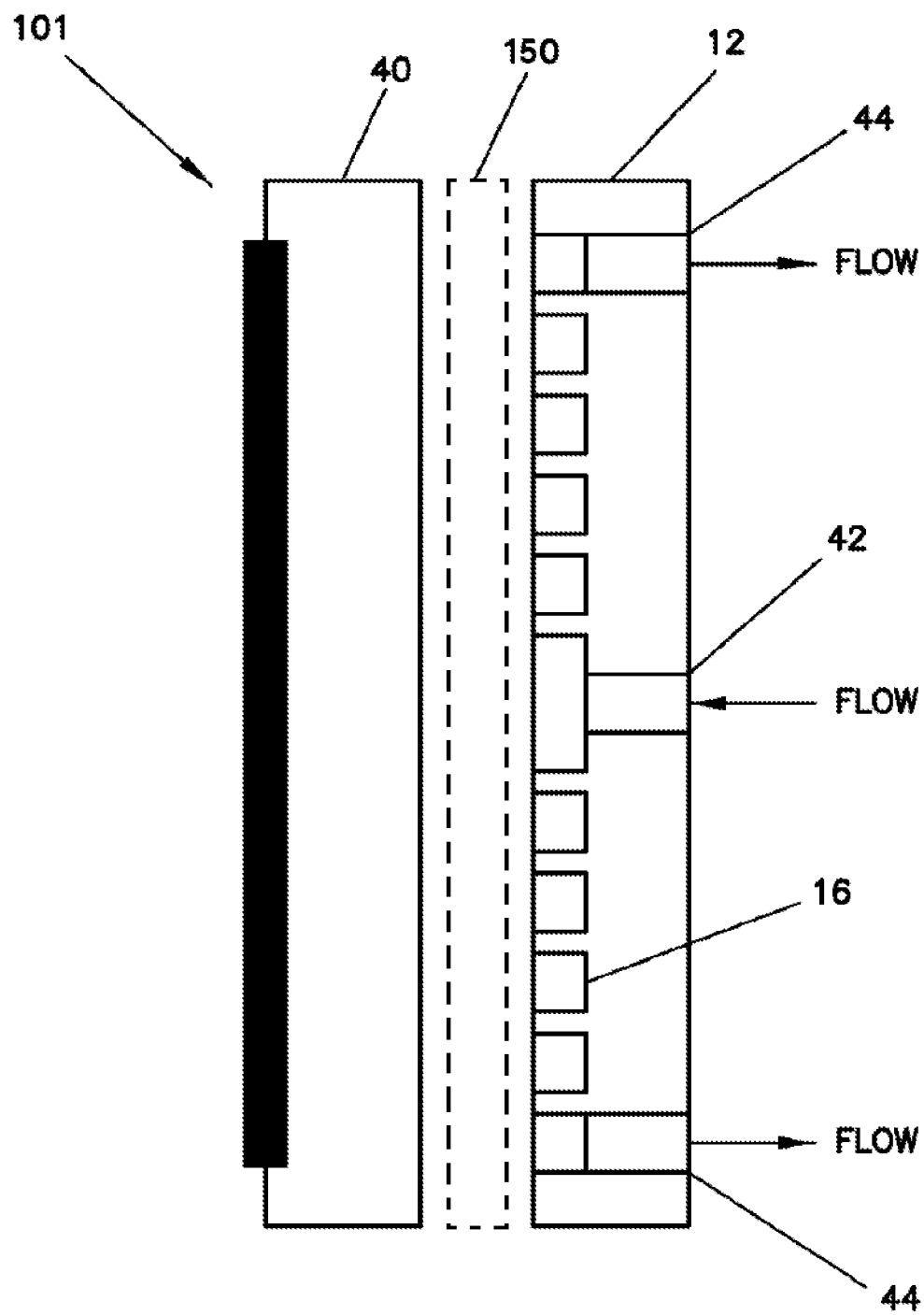
FIG. 3 shows an exploded side view of a micro-channel heat sink according to at least one embodiment of the present disclosure.

In at least one embodiment according to the present disclosure, a micro-channel heat sink 101 may include a pump (not shown) to further improve the heat transfer capacity of the heat sink 101 via forced convection. The pump may be a conventional pump or fan having rotating angled blades, or the pump may be a magnetic or inductive pump. An inductive pump uses a magnetically driven piston floating inside a cylindrical sleeve. Regardless of type, a pump may improve the heat transfer capacity of the heat sink 101 by creating a forced convection flow regime that will further increase the overall convective heat transfer coefficient of the heat sink 101. In such an embodiment as shown in FIG. 3, the micro-channel heat sink 101 may include one or more inlets 32 and one or more outlets 34 formed in the base plate 12 and in fluid communication with the plurality of micro-channels 16 to enable the flow of the thermal transfer fluid into and out of the heat sink 101, as indicated by arrows labeled "FLOW." In such an embodiment, the micro-channels 16 need not be oriented vertically because the forced flow will surpass any free convention effects. FIG. 3 is an exploded side view of a heat sink 101 in which the micro-channels 16 are disposed directly adjacent the LED 40, similar to the embodiment of FIG. 1. In at least one embodiment, the micro-channels 16 may not be in direct fluid contact with the LED 40 and may be separated by a middle plate 150 disposed therebetween.

In at least one embodiment according to the present disclosure, the micro-channel heat sink 101 may include closed loop flow in which the thermal transfer fluid is not exchanged with the ambient environment. For example, air flowing through the heat sink 101 may be routed from an outlet 34 on one edge of the heat sink 101 to an inlet 32 at another edge without mixing with ambient air. Further, the thermal transfer fluid may be filtered by any suitable means to prevent dust, moisture, or other particulates from entering and becoming trapped within the micro-channels 16, which would decrease the heat transfer capacity of the heat sink 101.

Figure 4:
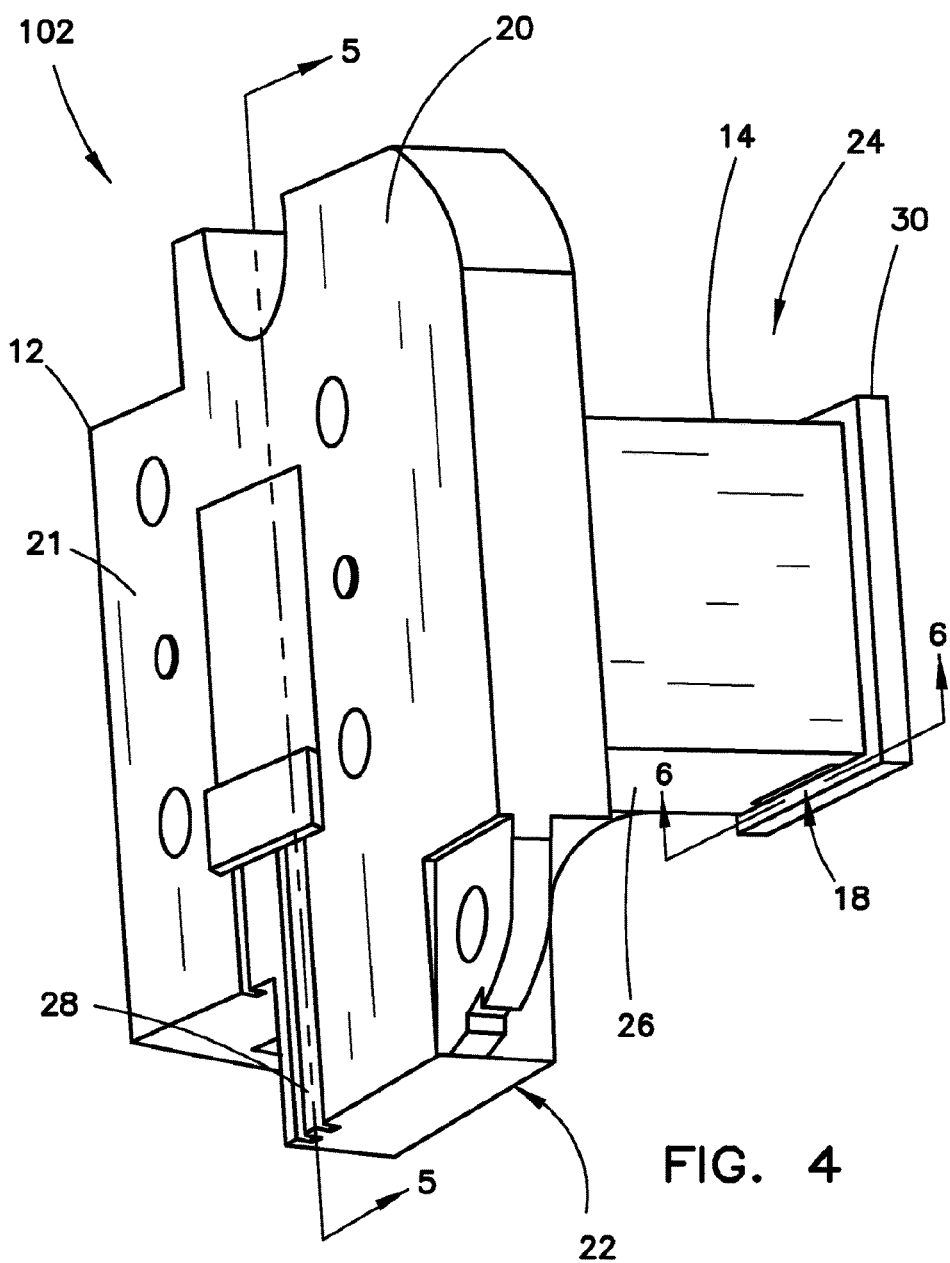
FIG. 4 shows an isometric view of a micro-channel heat sink according to at least one embodiment of the present disclosure.
Figure 5:
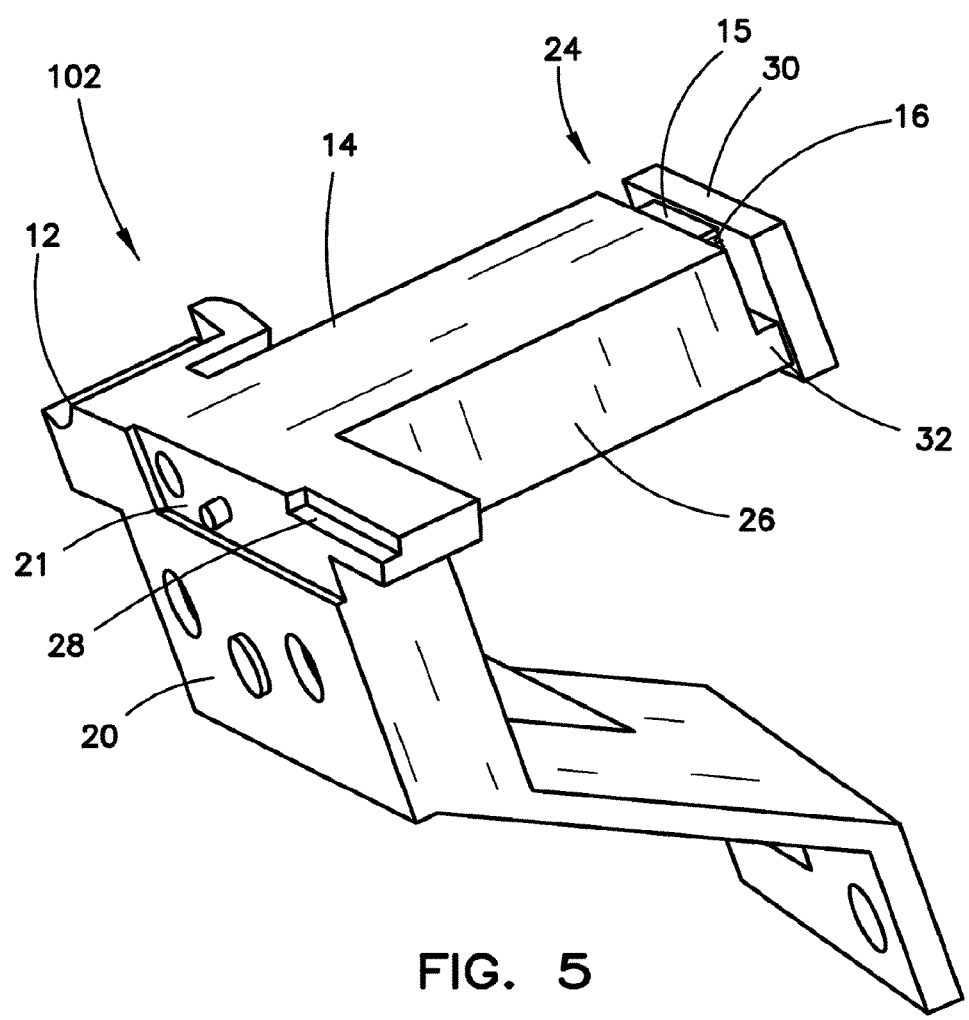
FIG. 5 shows a cross-sectional isometric view of a micro-channel heat sink according to at least one embodiment of the present disclosure taken at plane 5-5 of FIG. 4.

According to at least one embodiment of the present disclosure as shown in FIGS. 4 and 5, a heat sink 102 may include a base plate 12, an integral base leg 14, and a plurality of micro-fins 15 defining a plurality of micro-channels 16. The base plate 12 includes a front side 20, an opposing back side 22, and a pad 21 formed in the front side 20. The LED 40 may be disposed adjacent the front side 20 at or near the pad 21, and the base leg 14 may extend from the back side 22. The base plate 12 may further include one or more flow channels 28 disposed in the front side 20 enabling fluid communication between the ambient environment and the interface between the base plate 12 and the LED 40 mounted thereto.

The base leg 14 may include a distal end 24 opposite the back side 22 of the base plate 12. The base leg 14 may be formed integral with the base plate 12 as one component. Alternatively, the base leg 14 may be formed separate from and then affixed to the base plate 12 such that the base leg 14 and the base plate 12 are in thermal contact with one another. The mass of material comprising the base plate 12 and the base leg 14 may act as a thermal capacitance to retard LED junction temperature increase until sufficient convective flow develops through the micro-channels 16 to enable steady-state cooling of the LED 40.

Figure 6:
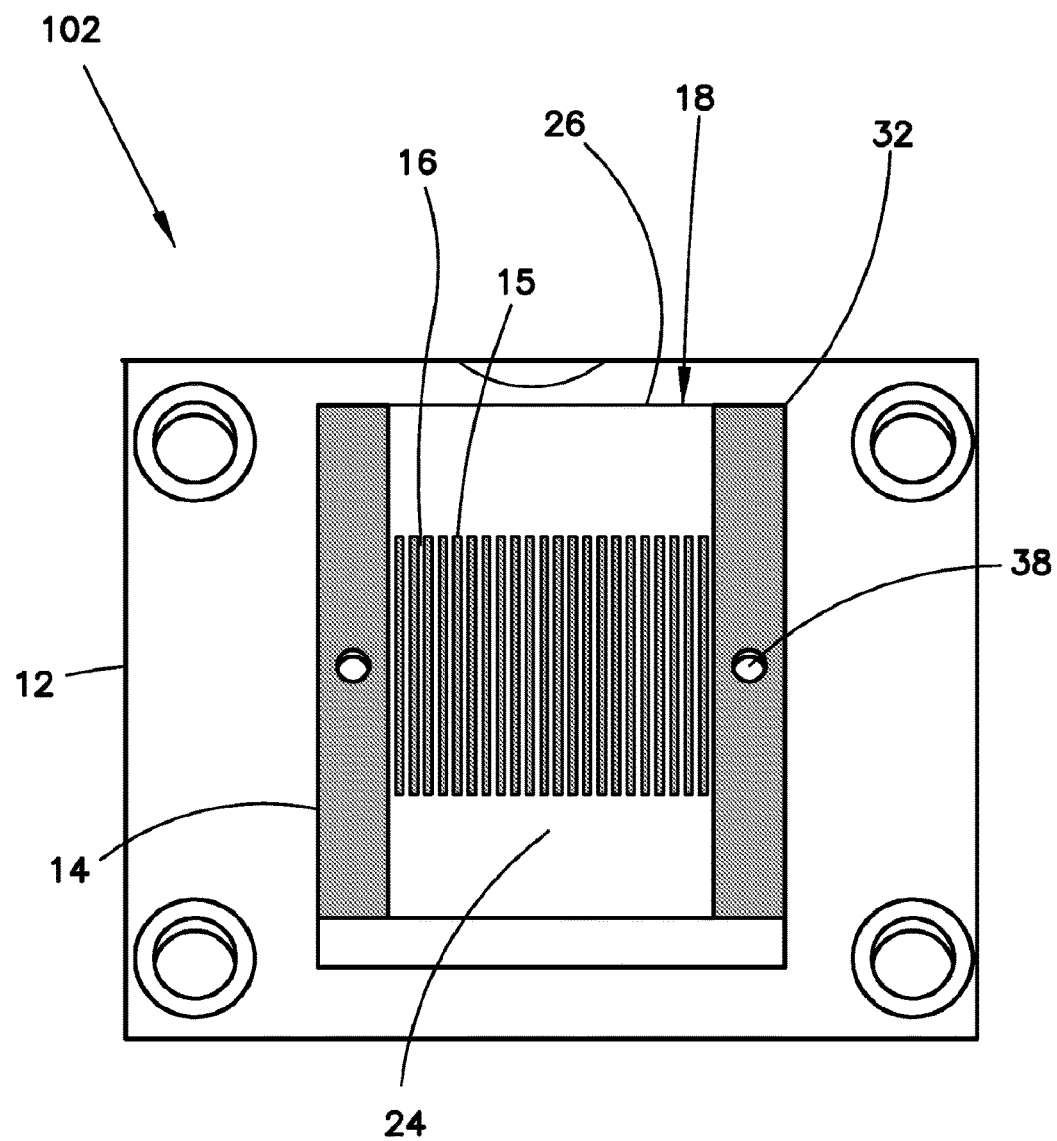
FIG. 6 shows a partial cross-sectional rear view of a micro-channel heat sink according to at least one embodiment of the present disclosure taken at plane 6-6 of FIG. 4.

As shown in FIGS. 4-6, the plurality of micro-fins 15 may be disposed adjacent the distal end 24 of the base leg 14, thereby defining the plurality of micro-channels 16 therebetween. The micro-channels 16 may be oriented vertically relative to gravity to enable free convective flow through the micro-channels 16. Further, the micro-channels 16 may be in fluid communication with the ambient environment via a header 18 through opposing side walls 26 of the base leg 14 at or near the distal end 24. The base leg 14 may further include one or more ribs 32, which extend from the distal end 24 of the base leg 14 substantially the same distance as the micro-fins 15, as shown in FIGS. 4 and 5. The micro-fins 15, and consequently the micro-channels 16, may extend from one side wall 26 of the base leg 14 to the opposing side wall 26. In at least one embodiment as shown in FIG. 6, the micro-fins 15, and consequently the micro-channels 16, may extend only partially between one side wall 26 of the base leg 14 to the opposing side wall 26.

In at least one embodiment, as shown in FIGS. 4 and 5, the heat sink 102 may include an insulating plate 30 disposed adjacent the distal end 24 of the base leg 14. The insulating plate 30 may be attached to the one or more ribs 32 via at least one plate mounting hole 38 formed in the rib 32, as shown in FIG. 6. The insulating plate 30 may be positioned to seat against the micro-fins 15, thereby capping the plurality of micro-channels 16. In such an embodiment, each micro-channel 16 is defined by the distal end 24 of the base leg 14, opposing micro-fins 15, and the insulating plate 30. The insulating plate 30 may be made of a thermally non-conductive material, including but not limited to plastic polymers. The use of a thermally non-conductive material for the insulating plate 30 insulates the distal end 24 and the micro-channels 16 from potential heat transfer from the ambient environment (e.g., an engine compartment) as discussed further herein.

Figure 7:
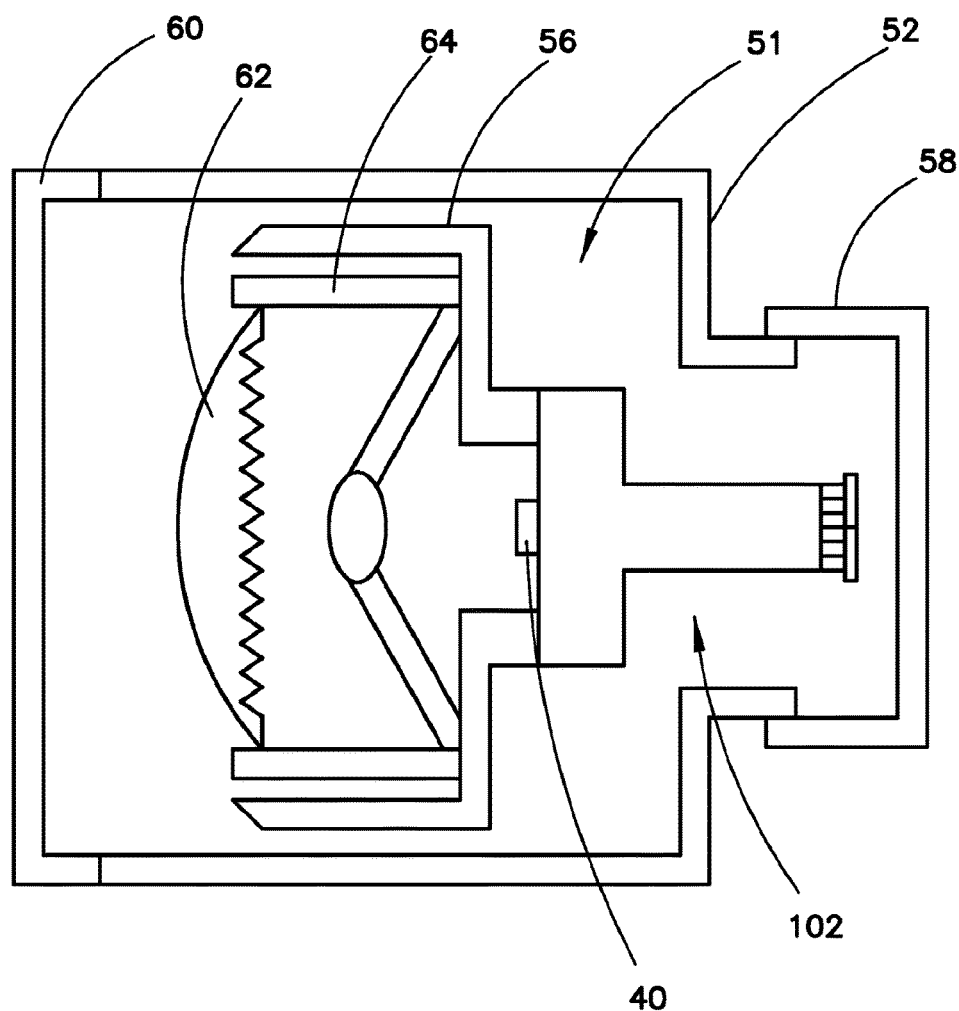
FIG. 7 shows a partial vertical cross-sectional view of a vehicle headlamp including a micro-channel heat sink according to at least one embodiment of the present disclosure.
Figure 8:
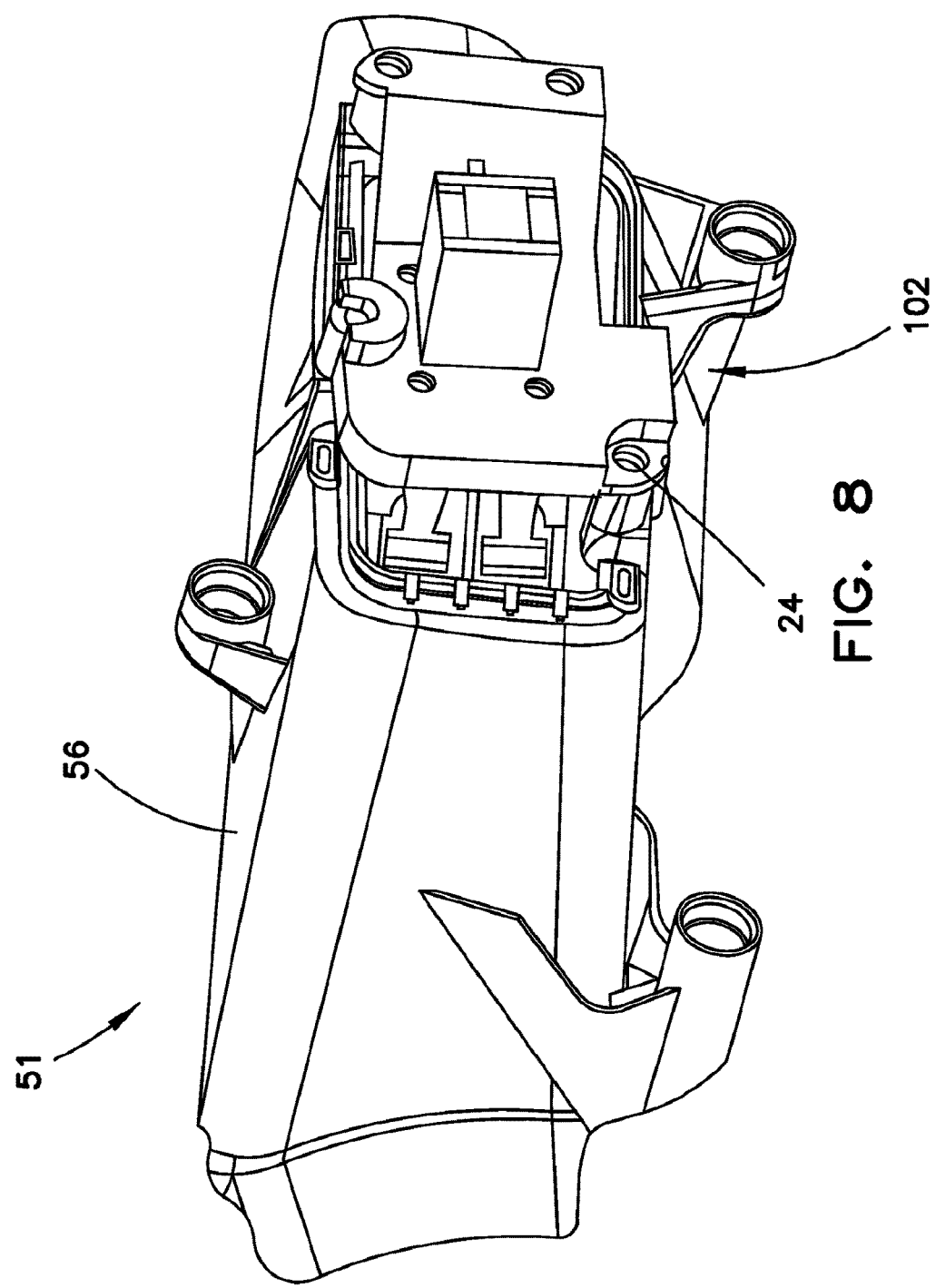
FIG. 8 shows a rear isometric view of a lamp subassembly including a micro-channel heat sink according to at least one embodiment of the present disclosure.

In at least one embodiment according to the present disclosure, the micro-channel heat sinks 10, 101, or 102 may be used in a headlamp assembly on a vehicle. As shown in FIGS. 7 and 8, a headlamp assembly 50 may include the LED 40 thermal connected to, but electrically isolated from, the heat sink 102, which is attached to bezel 56 via mounting holes 24 to form a subassembly 51. As shown in FIG. 7, the subassembly 51 may be disposed within a housing 52, the subassembly 51 being moveable attached to the housing 52, thereby enabling aim adjustment of the subassembly 51 relative to the housing 52. In at least one embodiment, the lamp assembly 50 may include one or more brackets (not shown) between the subassembly 51 and the housing 52 and/or between the heat sink 102 and the bezel 56 to further attach the heat sink 102 to the bezel 56 and/or the subassembly 51 to the housing 52. The lamp assembly 50 may further include a lens 62, including an optical prescription formed therein, disposed within the bezel 56 and supported by a lens holder 64 attached to the bezel 56. The lens 62 may be positioned such that light emitted from the LED 40 is refracted by the lens 62 into a desired light distribution pattern (i.e., beam pattern) for illuminating a roadway in front of a vehicle. The lamp assembly 50 may further include additional lenses, such as outer lens 60 attached to the housing 52 to protect the lamp assembly 50 from intrusion of water and debris. An access cap 58 may be removably attached to the housing 52 at or near the heat sink 10 to enable replacement or adjustment of the heat sink 102 or LED 40.

Figure 9:
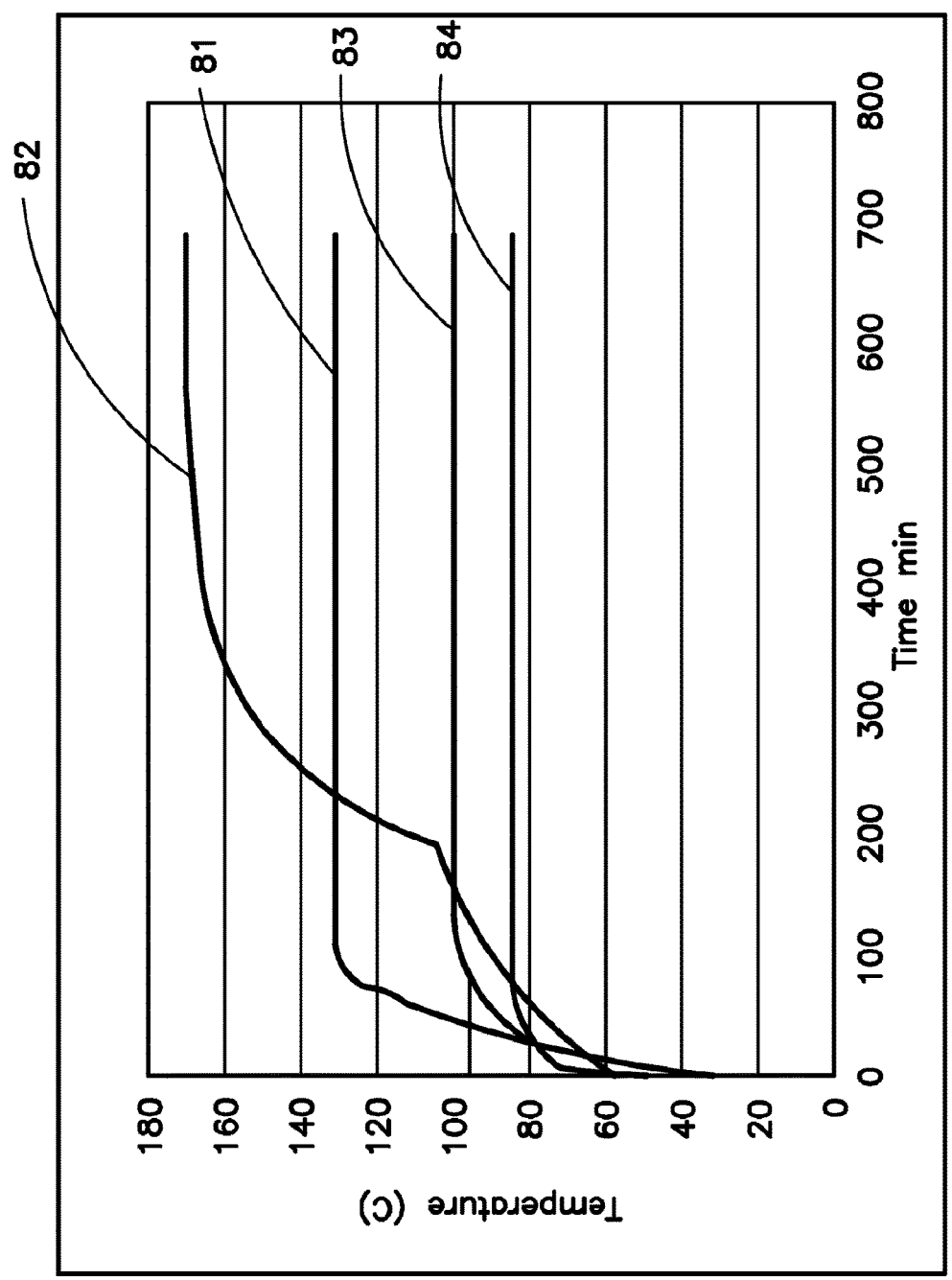
FIG. 9 presents graphical operating temperature data in degrees Celsius (° C.) over time in minutes (min.) for different embodiments of a micro-channel heat sink according to the present disclosure.

FIG. 9 graphically presents the results of test trials comparing the operating temperature increase of an LED 40 in degrees Celsius (° C.) over operating time in minutes (min) using different heat sinks thermally connected to a LED, where the LED was powered with 300 milliamps (mA) at 12 Volts (V) within a lamp assembly similar to the lamp assembly 50. In FIG. 9, data series 81 represents the operating temperature rise of the LED thermally attached to a conventional large fin heat sink known in the art. Data series 82 represents the operating temperature rise of the same LED thermally attached to an embodiment of the micro-channel heat sink 10 generally according to FIG. 1. Without being bound to a particular theory, the inflection point shown in data series 82 around the 200-minute mark may be the result of choked or rarefied flow through the micro-channels 16 due to increasing flow rate at elevated temperature. Data series 83 represents the operating temperature rise of the same LED thermally attached to an embodiment of the micro-channel heat sink 102 generally according to FIGS. 4-7. Data series 84 represents the operating temperature rise of the same LED thermally attached to an embodiment of the micro-channel heat sink 101 generally according to FIG. 3 and further including a pump (not shown) to generate forced convection flow through the heat sink 101.

As shown in FIG. 9, the embodiment of heat sink 102 had a steady-state operating temperature more than 30° C. lower than the conventional heat sink, thereby demonstrating the superior heat transfer capacity of the heat sink 102. Moreover, the embodiment of heat sink 101 had a steady-state operating temperature nearly 20° C. lower than the embodiment of heat sink 102, demonstrating the increased heat transfer capacity of using forced convection flow.

The micro-channel heat sinks 10, 101, and 102 enable a reduction in mass in comparison to conventional finned heat sinks. For example, where the conventional heat sink of data series 81 had a mass of 385 grams (g), the heat sink 102 of data series 83 had a mass of 200 g, and the heat sink 101 of data series 84 had a mass of 16 g. In at least one embodiment according to the present disclosure, each micro-channel 16 may be about 400 μm wide and about 2000 μm deep. In alternative embodiments, the micro-channels 16 may be between about 10 and 500 μm wide and about 500 to 5000 μm deep. In at least one embodiment, the front side 20 of the base plate 12 may have a surface area of about 3000 square millimeters ($mm^2$), and the distance from the front side 20 and the back side 22 may be about 10 mm. In alternative embodiments, the base plate 12 may have a surface area of about 900 $mm^2$. In at least one embodiment, the base leg 14 may extend approximately 38 mm from the back side 22, and the side wall 26 may be about 20 mm wide. In alternative embodiments, the base leg 14 may extend between approximately 30 and 45 mm from the back side 22, and the side wall 26 may be between about 10 and 40 mm wide. The particular dimensions and a given embodiment of the heat sinks 10, 101, and 102 may be determined by the specific power and heat dissipation requirements of the LED 40.

While various embodiments of a micro-channel heat sink for an LED vehicle headlamp have been described in considerable detail herein, the embodiments are merely offered by way of non-limiting examples of the disclosure described herein. It will therefore be understood that various changes and modifications may be made, and equivalents may be substituted for elements thereof, without departing from the scope of the disclosure and are intended to encompass any later appended claims. Indeed, this disclosure is not intended to be exhaustive or to limit the scope of the disclosure.

Further, in describing representative embodiments, the disclosure may have presented a method and/or process as a particular sequence of steps. However, to the extent that the method or process does not rely on the particular order of steps set forth herein, the method or process should not be limited to the particular sequence of steps described. Other sequences of steps may be possible. Therefore, the particular order of the steps disclosed herein should not be construed as limitations of the present disclosure. In addition, disclosure directed to a method and/or process should not be limited to the performance of their steps in the order written. Such sequences may be varied and still remain within the scope of the present disclosure.

The invention claimed is:

1. A heat sink for a semiconductor device, the heat sink comprising:
   a base plate including a first side and a second side;
   a back plate disposed adjacent the second side of the base plate;
   a leg extending from the second side of the base plate, the leg including a distal end opposite the base plate, wherein the back plate is disposed adjacent the distal end of the leg;
   a plurality of fins arranged in the distal end of the leg;
   a plurality of micro-channels defined by the plurality of fins; and
   wherein the back plate is directly fastened to the leg wherein a cross-sectional area of the back plate in a plane perpendicular to the extending direction of the leg is less than a cross-sectional area of the first side of the base plate in a plane perpendicular to the extending direction of the leg.

2. The heat sink of claim 1, wherein the surface area of the first side of the base plate is greater than the surface area of the distal end of the leg.

3. The heat sink of claim 1, wherein the first side of the base plate further comprises a portion adapted to receive and make thermal contact with a semiconductor device.

4. The heat sink of claim 3, wherein the base plate further comprises one or more flow channels formed in the first side allowing a fluid to be in thermal communication with the portion.

5. The heat sink of claim 1, wherein the semiconductor device is a light-emitting diode.

6. The heat sink of claim 1, wherein the leg is integral with the base plate, and the plurality of fins is integral with the leg, wherein one or more ribs having at least one plate mounting hole defined therein extend from the distal end of the leg, and wherein the back plate is directly fastened to the one or more ribs at the at least one plate mounting hole.

7. The heat sink of claim 1, wherein the base plate and the leg are formed of a thermally conductive material.

8. The heat sink of claim 1, the heat sink further comprising:
   opposing walls extending between the distal end of the leg and the back plate; and
   one or more headers formed between each of the opposing walls at or near the distal end, each header in fluid communication with the plurality of micro-channels.

9. The heat sink of claim 1, wherein each micro-channel has a width between about 10 and about 500 microns.

10. The heat sink of claim 9, wherein each micro-channel has a width of approximately 400 microns.

11. The heat sink of claim 1, wherein each micro-channel has a depth between about 500 and about 5,000 microns.

12. The heat sink of claim 11, wherein each micro-channel has a depth of approximately 2,000 microns.

13. The heat sink of claim 1, wherein the leg has a length from the base plate to the distal end of between about 30 and about 45 millimeters.

14. The heat sink of claim 13, wherein the leg has a length from the base plate to the distal end of approximately 38 millimeters.

15. The heat sink of claim 1, wherein the surface area of the first side of the base plate is about 3,000 square millimeters, and the thickness of the base plate from the first side to the second side is about 10 millimeters.

16. A lamp for a vehicle, the lamp comprising:
   a lens attached to a housing, the lens and the housing defining a volume;
   a heat sink at least partially disposed within the volume, the heat sink comprising:
      a base plate including a first side and a second side;
      a leg extending from the second side of the base plate, the leg including a distal end opposite the base plate;
      a leg plate disposed adjacent the distal end of the leg;
      a plurality of fins arranged in the distal end of the leg and disposed between the base plate and the leg plate;
      a plurality of micro-channels defined by the distal end of the leg, the plurality of fins, and the leg plate; and
   a light-emitting diode attached to and in thermal contact with the first side of the base plate,
   wherein the plurality of micro-channels allow a fluid to be in thermal communication with the volume; and
   wherein the leg plate is directly fastened to the leg wherein a cross-sectional area of the leg plate in a plane perpendicular to the extending direction of the leg is less than a cross-sectional area of the first side of the base plate in a plane perpendicular to the extending direction of the leg.

17. The heat sink of claim 16, wherein the surface area of the first side of the base plate is greater than the surface area of the distal end of the leg.

18. The heat sink of claim 16, wherein the base plate further comprises one or more flow channels formed in the first side in fluid communication with the plurality of micro-channels.

19. The heat sink of claim 16, wherein the leg is integral with the base plate.

20. The heat sink of claim 16, wherein the leg plate is formed of a thermally insulative material.

21. The heat sink of claim 16, wherein the leg includes one or more headers at or near the distal end, each header in fluid communication with the plurality of micro-channels.

22. The heat sink of claim 16, wherein each micro-channel has a width between about 10 and about 500 microns.

23. The heat sink of claim 16, wherein each micro-channel has a depth between about 500 and about 5,000 microns.

24. The heat sink of claim 16, wherein the leg has a length from the base plate to the distal end of between about 30 and about 45 millimeters.

\* \* \* \* \*